(12) United States Patent
Hatanaka et al.

(10) Patent No.: US 7,701,728 B2
(45) Date of Patent: Apr. 20, 2010

(54) ELECTRONIC COMPONENT MODULE AND RADIO COMUNICATIONS EQUIPMENT

(75) Inventors: Hidefumi Hatanaka, Kirishima (JP); Tomohiko Taniguchi, Higashiohmi (JP)

(73) Assignees: Kyocera Corporation, Kyoto (JP); Kyocera Kinseki Corporation, Tokyo (JP)

( * ) Notice: Subject to any disclaimer, the term of this patent is extended or adjusted under 35 U.S.C. 154(b) by 0 days.

(21) Appl. No.: 11/574,566

(22) PCT Filed: Oct. 28, 2005

(86) PCT No.: PCT/JP2005/019927

§ 371 (c)(1),
(2), (4) Date: Mar. 1, 2007

(87) PCT Pub. No.: WO2006/046713

PCT Pub. Date: Apr. 5, 2006

(65) Prior Publication Data

US 2008/0019112 A1    Jan. 24, 2008

(30) Foreign Application Priority Data

Oct. 28, 2004    (JP) .............................. 2004-313764

(51) Int. Cl.
    *H05K 7/14*    (2006.01)
(52) U.S. Cl. ................ 361/800; 361/764; 174/257; 174/521; 257/433; 257/690; 257/707
(58) Field of Classification Search ................ 361/761, 361/800, 764; 257/48, 678, 738, 659, 737, 257/433, 690, 707; 174/257, 521
See application file for complete search history.

(56) References Cited

U.S. PATENT DOCUMENTS

| 5,325,072 | A | * | 6/1994 | Kohjiro et al. | ............... | 330/286 |
| 5,639,989 | A | * | 6/1997 | Higgins, III | ................ | 174/386 |
| 5,656,857 | A | * | 8/1997 | Kishita | ........................ | 257/690 |
| 5,668,406 | A | * | 9/1997 | Egawa | ......................... | 257/690 |
| 5,777,847 | A | * | 7/1998 | Tokuno et al. | ............... | 361/705 |
| 5,847,451 | A | * | 12/1998 | Ohtaki et al. | ................ | 257/697 |
| 5,962,854 | A | * | 10/1999 | Endo | .......................... | 250/349 |
| 5,977,626 | A | * | 11/1999 | Wang et al. | .................. | 257/707 |
| 6,069,196 | A | * | 5/2000 | Akao et al. | .................. | 524/424 |
| 6,376,907 | B1 | * | 4/2002 | Takano et al. | ................ | 257/704 |
| 6,407,334 | B1 | * | 6/2002 | Jimarez et al. | ............... | 174/557 |
| 6,409,859 | B1 | * | 6/2002 | Chung | .......................... | 156/69 |

(Continued)

FOREIGN PATENT DOCUMENTS

JP    06-268532    9/1994

(Continued)

Primary Examiner—Tuan T Dinh
Assistant Examiner—Xiaoliang Chen
(74) Attorney, Agent, or Firm—Hogan & Hartson LLP

(57) ABSTRACT

An IC element 2 having an oscillation circuit and an amplification circuit is mounted on a wiring board 1, the IC element 2 is covered with a sealing resin layer 4 having a window 4*a* on an upper surface of the IC element 2, and a shielding layer 5 is made to adhere to the sealing resin layer 4 and the window 4*a* from above. In a simple configuration, the entrance of electromagnetic waves into the IC element 2 is reduced, which allows a transmission signal from the IC element 2 to be stabilized.

4 Claims, 3 Drawing Sheets

U.S. PATENT DOCUMENTS

| | | | | |
|---|---|---|---|---|
| 6,649,991 | B1 * | 11/2003 | Chen et al. | 257/433 |
| 6,674,159 | B1 * | 1/2004 | Peterson et al. | 257/680 |
| 6,731,184 | B1 * | 5/2004 | Muto et al. | 333/103 |
| 6,795,120 | B2 * | 9/2004 | Takagi et al. | 348/294 |
| 6,819,566 | B1 * | 11/2004 | Danovitch et al. | 361/704 |
| 6,865,084 | B2 * | 3/2005 | Lin et al. | 361/704 |
| 7,064,428 | B2 * | 6/2006 | Tong et al. | 257/707 |
| 7,098,079 | B2 * | 8/2006 | Chrysler et al. | 438/122 |
| 7,327,005 | B2 * | 2/2008 | Brechignac et al. | 257/434 |
| 7,382,628 | B2 * | 6/2008 | Kawamoto et al. | 361/764 |
| 7,552,532 | B2 * | 6/2009 | Stelzl et al. | 29/855 |
| 2002/0096767 | A1 * | 7/2002 | Cote et al. | 257/738 |
| 2003/0189910 | A1 * | 10/2003 | Yamada et al. | 370/335 |
| 2004/0263671 | A1 * | 12/2004 | Takagi et al. | 348/340 |
| 2005/0056860 | A1 * | 3/2005 | Kitazawa et al. | 257/107 |
| 2005/0072972 | A1 * | 4/2005 | Tashiro et al. | 257/48 |
| 2005/0224728 | A1 * | 10/2005 | Schwarz et al. | 250/506.1 |
| 2005/0261036 | A1 * | 11/2005 | Sekine et al. | 455/572 |
| 2007/0164409 | A1 * | 7/2007 | Holland | 257/678 |

FOREIGN PATENT DOCUMENTS

| | | |
|---|---|---|
| JP | 11-040709 | 2/1999 |
| JP | 2000-243882 | 9/2000 |
| JP | 2004-172176 | 6/2004 |

\* cited by examiner

ELECTRONIC COMPONENT MODULE AND RADIO COMUNICATIONS EQUIPMENT

CROSS-REFERENCE TO THE RELATED APPLICATION

This application is a national phase of international application No. PCT/JP2005/019927 filed Oct. 28, 2005, the entire contents of which are incorporated by reference. This application also claims benefit of priority under 35 U.S.C. 119 to Japanese Patent Application No. 2004-313764 filed Oct. 28, 2004, the entire contents of which are incorporated by reference.

TECHNICAL FIELD

The present invention relates to an electronic component module used for radio communication or the like and radio communications equipment using the same.

BACKGROUND ART

Conventionally, electronic component modules for outputting signals for transmission, which are used for radio communication or the like, have been used.

Known as an example of such conventional electronic component modules has been one in which a flip-chip mounting-type IC element is mounted on a wiring board, and a sealing resin layer covering the IC element is formed from above (see Patent Document 1).

The electronic component module has an oscillation circuit and an amplification circuit, and oscillates a reference signal using the oscillation circuit, mixes a data signal with the reference signal, amplifies a mixture obtained using the amplification circuit, and outputs a signal for transmission. Small-sized radio communications equipment that can be mounted on personal computers, portable information equipment, and so forth is configured by connecting antennas, transmitting/receiving circuits, and so forth to such electronic component modules.

Patent Document 1: Japanese Unexamined Patent Publication No. 2000-243882

DISCLOSURE OF THE INVENTION

Problems to be Solved by the Invention

In a case where a conventional electronic component module is incorporated into radio communications equipment, for example, however, electromagnetic waves leaking out of other high-frequency component incorporated into the radio communications equipment easily enter as noise an oscillation circuit and an amplification circuit of the electronic component module, so that a state where the electronic component module does not normally function frequently occurs.

That is, in the conventional electronic component module, a sealing resin layer covering an IC element mounted on a wiring board passes electromagnetic waves. Therefore, unnecessary electromagnetic waves easily enter the oscillation circuit and the amplification circuit in the IC element, so that the operation of the electronic component module is made unstable.

The present invention has been made in view of the foregoing disadvantage and has an object to provide an electronic component module in which an IC element is mounted on a wiring board, which can be stably operated by reducing the entrance of unnecessary electromagnetic waves in a simple configuration, and radio communications equipment using the same.

Means for Solving the Problems

An electronic component module according to the present invention is characterized by comprising a sealing resin layer covering an IC element, excluding a part of a surface, on the opposite side of a wiring board, of the IC element; and a shielding layer made to adhere to the sealing resin layer and a portion, which is not covered with the sealing resin layer, of the IC element.

In the electronic component module according to the present invention, the IC element is covered with the sealing resin layer having a window so as to expose a part of an upper surface of the IC element, and the shielding layer is made to adhere to the upper surface of the IC element exposed from the window and the sealing resin layer. This configuration causes the shielding layer to be held at approximately the same potential as a substrate potential of the IC element. This makes it possible to restrain the variation in the substrate potential of the IC element and to stabilize the operation of the IC element. Because of this and that the upper surface of the IC element is covered with the shielding layer, unnecessary electromagnetic waves from the exterior do not easily enter circuit wiring or the like composing an oscillation circuit and an amplification circuit in the IC element. Therefore, the electronic component module can be stably operated.

It is preferable that the outer periphery of the shielding layer has an extension extended to the wiring board along a side surface of the sealing resin layer, and the extension is made to adhere to an upper surface and/or a side surface of the wiring board. This configuration causes the IC element to be covered with the shielding layer throughout. Thus, the area of a region having the same potential as the substrate potential is enlarged. Therefore, it is possible to restrain the variation in the reference potential of the IC element and stabilize the operation of the IC element.

It is preferable that a notch is formed over the outer periphery of the wiring board, and that the extension of the shielding layer is made to adhere to the notch. Thus, joining between the shielding layer and the wiring board is strengthened, so that the shielding layer can be made to adhere to the wiring board more reliably.

It is preferable that the sealing resin layer and the outer periphery of a surface, on which the IC element is mounted, of the wiring board are covered in an annular shape with the extension of the shielding layer. This configuration causes electromagnetic waves that have entered the shielding layer to be efficiently dispersed onto the outer periphery of the wiring board, so that the entrance of unnecessary electromagnetic waves into the IC element is further reduced.

Furthermore, in the electronic component module according to the present invention, it is preferable that a filter element including an LC resonance circuit is contained in the wiring board, and that a shielding conductor pattern is interposed within the wiring board positioned between the filter element and the IC element. The filter element including the LC resonance circuit is thus contained in the wiring board, so that the IC resonance circuit can be formed without providing a chip component such as a chip inductor or a chip capacitor on the wiring board. Therefore, the electronic component module can be miniaturized. Moreover, the shielding conductor pattern held at the reference potential is interposed within the wiring board positioned between the filter element and the IC element, so that electromagnetic interference that can occur between the filter element and the IC element can be restrained.

It is preferable that a lower end of the extension of the shielding layer is arranged at a height position equal to or less than the shielding conductor pattern. This configuration allows the entrance of electromagnetic waves from the side into the IC element to be also restrained, so that the operation of the electronic component module can be made more stable.

Radio communications equipment according to the present invention comprises the above-mentioned electronic component module and an antenna and a transmitting/receiving circuit that are connected to the electronic component module. This configuration eliminates the necessity of forming, between the electronic component module and other high-frequency components together incorporated into the radio communications equipment, a structure for restraining the effect of electromagnetic waves leaking out of each of components, for example, a structure for arranging the electronic component module and the other high-frequency components sufficiently spaced apart from each other and a structure for mounting a shielding cover made of a metal on the electronic component module. Thus, the configuration of the radio communications equipment is simplified, so that the radio communications equipment can be one being small in size and superior in communication characteristics.

The foregoing and other advantages, features, and effects of the present invention will become more apparent from the following description of an embodiment when taken in conjunction with the accompanying drawings.

Figure 1:
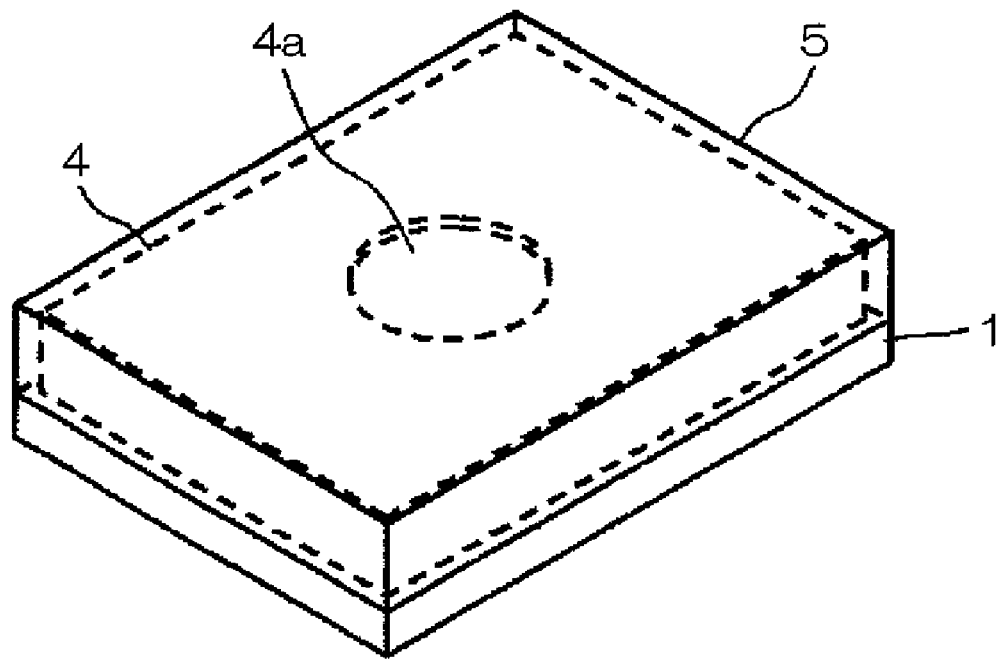
FIG. 1 is a schematic perspective view of an electronic component module according to an embodiment of the present invention.

DESCRIPTION OF REFERENCES 1. wiring board
2. IC element
3. chip-type electronic component
4. sealing resin layer
4a. window
5. shielding layer
7. shielding conductor pattern
8. filter element
9. notch
10. main wiring board
41. first dicing blade
42. second dicing blade

BEST MODE FOR CARRYING OUT THE INVENTION

An electronic component module according to the present invention will be described in detail on the basis of the accompanying drawings. In the present embodiment, description is made on an electronic component module serving as a communication module such as Bluetooth.

Figure 2:
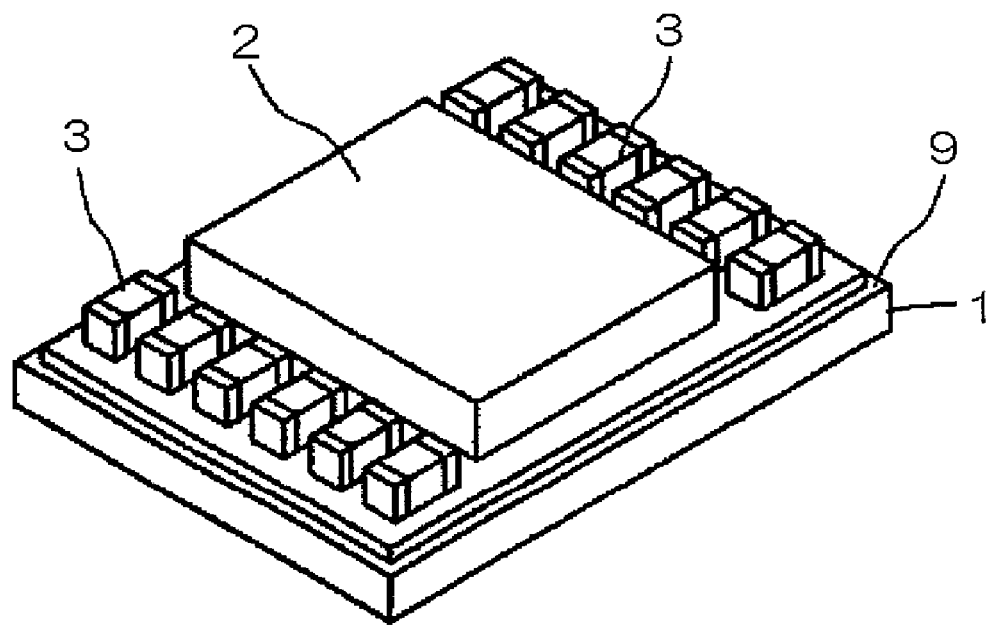
FIG. 2 is a perspective view showing the appearance, from which a shielding layer 5 and a sealing resin layer 4 are omitted, of the electronic component module.
Figure 3:
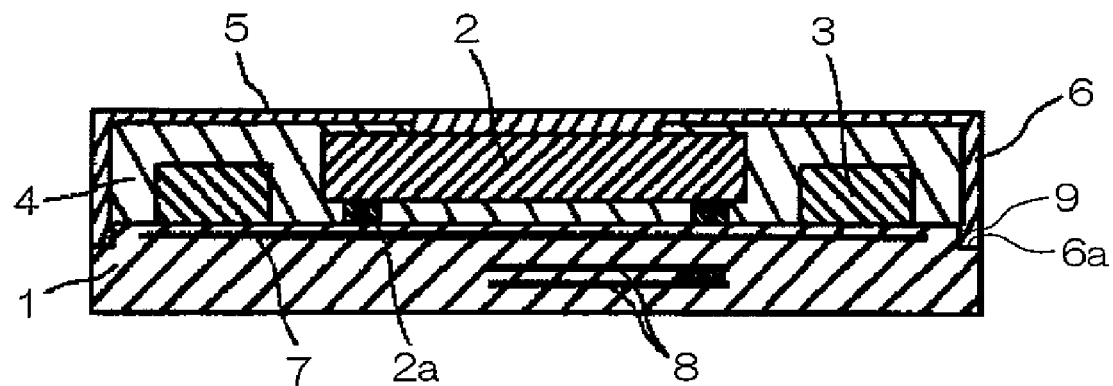
FIG. 3 is a cross-sectional view of the electronic component module.

FIGS. 1 and 2 are schematic perspective views of an electronic component module according to an embodiment of the present invention. FIG. 3 is a cross-sectional view of the electronic component module.

The electronic component module has a configuration in which an IC element 2 mounted on a wiring board 1 is covered with a sealing resin layer 4. A shielding layer 5 is made to adhere to a surface of the sealing resin layer 4.

In FIG. 2, the shielding layer 5 and the sealing resin layer 4 are omitted.

The wiring board 1 is so adapted that circuit wiring and a connection pad mainly composed of metal materials such as Ag, Cu, W, and Mo are formed inside of and on a surface of a laminate obtained by laminating a plurality of insulating layers composed of a ceramic material such as glass ceramics or alumina ceramics.

A filter element 8 composed of an LC resonance circuit and the like is formed inside the wiring board 1, as shown in FIG. 3. The filter element 8 has the function of selecting a data signal in a predetermined frequency band from a signal to be inputted and outputted to and from the IC element 2.

A shielding conductor pattern 7 positioned between the filter element 8 and the IC element 2 is further interposed within the wiring board 1 to enhance isolation properties between the IC element 2 and the filter element 8.

The wiring board 1 is produced by applying a conductor paste serving as circuit wiring and a connection pad to a surface of a ceramic green sheet, for example, obtained by adding and mixing a suitable organic solvent to and with predetermined glass-ceramics material powder using a conventionally well-known screen printing method or the like and laminating and press-molding a plurality of conductor pastes, followed by calcinations at high temperatures when the wiring board 1 is composed of glass-ceramics.

The IC element 2 mounted on the wiring board 1 is obtained, for example, by forming circuit wiring composed of Al or the like on a semiconductor device substrate composed of Si, GaAs or the like to compose an oscillation circuit and an amplification circuit and resin-molding the whole into a rectangular parallelepiped shape.

A surface having the circuit wiring formed thereon is taken as a lower surface, and corresponding ones of a plurality of electrode pads formed on the lower surface and a plurality of connection pads formed on the wiring board 1 are electrically and mechanically joined to each other with a conductive joining material 2a. In such a way, the IC element 2 is flip-chip mounted on the wiring board 1.

Some of the plurality of electrode pads formed on the lower surface of the IC element 2 are ones for a reference potential. Such electrode pads for the reference potential are joined to the connection pads for the reference potential formed on the wiring board. Thus, a substrate potential of the IC element 2 is approximately equal to the reference potential.

Here, the "reference potential" indicates a low potential to be the basis for obtaining a power supply voltage for driving the IC element 2, and is set to a ground potential (approximately 0V), for example, in the present embodiment.

Not only the IC element 2 but also chip-type electronic components 3 such as a chip capacitor, a chip inductor, and a diode are also mounted on the wiring board 1. The electronic components 3 are electrically connected to the IC element 2 to constitute a predetermined circuit such as an oscillation circuit.

A resin material such as epoxy, for example, is used for the sealing resin layer 4 formed on an upper surface of the wiring board 1. The sealing resin layer 4 has a configuration in which it covers the IC element 2 in a form having a circular window 4a, for example, such that at least a part of an upper surface of the IC element 2 is exposed and covers the chip-type electronic components 3.

The shielding layer 5 made to adhere to the surface of the sealing resin layer 4 is composed of a resin material such as epoxy having metal powder of Ag, Cu, Pd, Al, Ni, Fe, or the like dispersed therein, for example. The content of the metal powder is 50 to 90% by weight and more preferably 60 to 80% by weight of the whole resin material including the metal powder.

The shielding layer 5 has the function of shielding electromagnetic waves by thus dispersing the metal powder in the resin material. Simultaneously, the thermal conductivity of the shielding layer 5 is improved.

The shielding layer 5 is formed so as to cover the whole surface of the sealing resin layer 4 and adhere to the upper surface of the IC element 2 exposed from the window 4a provided on the sealing resin layer 4. The shielding layer 5 is held at approximately the same potential as the substrate potential of the IC element 2 by thus bringing the IC element 2 and the shielding layer 5 into contact with each other, so that the variation in the substrate potential of the IC element 2 can be restrained. Further, the shielding layer 5 is provided on the sealing resin layer 4 and the upper surface of the IC element 2, so that electromagnetic waves do not easily enter the circuit wiring composing the oscillation circuit and the amplification circuit within the IC element 2, which allows the operation of the electronic component module to be stabilized.

If a conductor pattern electrically connected to the electrode pad for the reference potential in the IC element 2, previously described, is pulled to the upper surface of the IC element 2, and the shielding layer 5 is brought into direct contact with the conductor pattern held at the same potential as the reference potential, unnecessary electromagnetic waves can be effectively prevented from entering the inside of the IC element 2 from the exterior.

Since heat generated by a circuit formed inside the IC element 2, for example, the amplification circuit is efficiently radiated outward through the shielding layer 5, the operation of the IC element 2 is stabilized.

In the configuration of the present electronic component module, the outer periphery of the shielding layer 5 is extended toward a portion below the IC element 2 along a side surface of the sealing resin layer 4 so that the extension 6 is made to adhere to a surface of the wiring board 1. This causes the IC element 2 to be covered with the shielding layer 5 throughout, so that the entrance of electromagnetic waves into the IC element 2 is further reduced. The heat generated from the IC element 2 is conducted toward the wiring board 1 through the shielding layer 5. Thus, excessive heat is prevented from being stored in the IC element 2 so that the operation of the IC element 2 is made more stable.

In the present embodiment, a notch 9 is formed over the outer periphery of the upper surface of the wiring board 1, and the extension 6 of the shielding layer 5 is made to adhere to a surface, facing the notch 9, of the wiring board 1, as shown in FIG. 3.

Such a configuration causes joining between the shielding layer 5 and the wiring board 1 to be strengthened, so that the shielding layer 5 can be more reliably made to adhere to the wiring board 1 almost without forming a clearance in a joint between the shielding layer 5 and the wiring board 1.

Furthermore, the outer periphery of the interface between the sealing resin layer 4 and the wiring board 1 is covered in an annular shape with the extension 6 of the shielding layer 5. This configuration causes the electromagnetic waves that have entered the shielding layer 5 from the exterior to be efficiently dispersed to flow to the outer periphery of the wiring board 1, so that the entrance of the electromagnetic waves into the IC element 2 is further reduced.

Moreover, the extension 6 of the shielding layer 5 is formed such that its lower end 6a is lower than the height position of the shielding conductor pattern 7 provided within the wiring board 1. In other words, the shielding conductor pattern 7 is arranged at a position higher than the lower end 6a of the extension 6 of the shielding layer 5. This allows the entrance of the electromagnetic waves from lateral sides into the IC element 2 to be also effectively prevented, which allows the operation of the electronic component module to be made even more stable.

The shielding conductor pattern 7 may be exposed on the side surface of the wiring board 1 to connect an exposed portion of the shielding conductor pattern 7 and the extension 6 of the shielding layer 5.

Further, the wiring board 1 contains the filter element 8 including the LC resonance circuit, as described above, and the shielding conductor pattern 7 held at the reference potential is interposed within the wiring board 1 positioned between the filter element 8 and the IC element 2. This allows electromagnetic interference that can occur between the filter element 8 and the IC element 2 to be restrained. The filter element 8 forms the LC resonance circuit inside the wiring board 1 without providing chip components such as a chip inductor and a chip capacitor on the wiring board. Therefore, the whole configuration of the electronic component module can be miniaturized.

Thus, the above-mentioned electronic component module according to the present invention functions as a communication module whose operation is made significantly stable by making the shielding layer 5 adhere to the whole surface of the sealing resin layer 4 covering the IC element 2 to restrain the variation in the reference potential of the IC electrode 2 as well as to prevent unnecessary electromagnetic waves from entering the circuit wiring composing the oscillation circuit, the amplification circuit, and so forth within the IC element 2.

Figure 4:
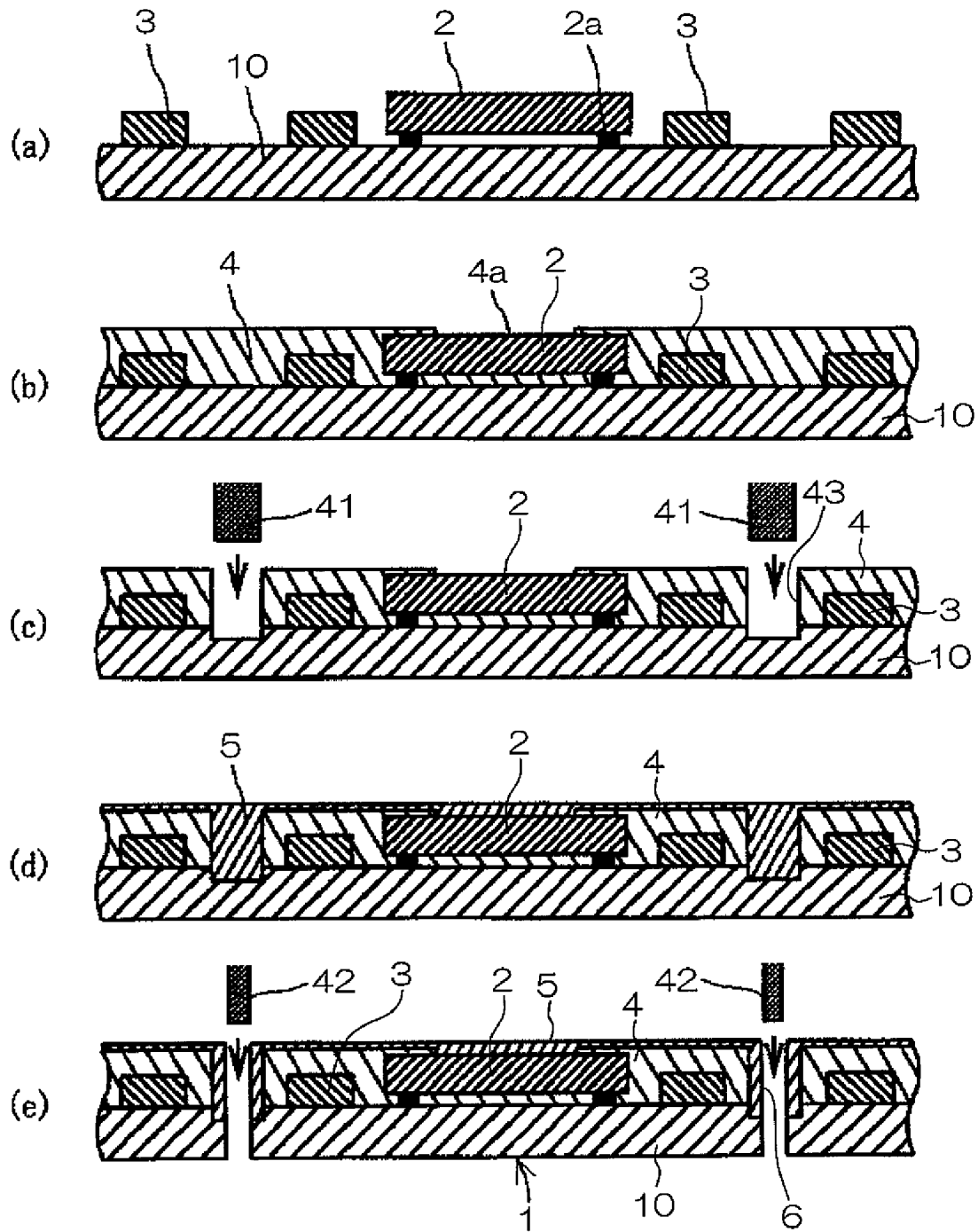
FIGS. 4 (a) to 4 (e) are diagrams for explaining the steps of manufacturing the electronic component module.

A method of manufacturing the electronic component module according to the present embodiment will be then described using FIGS. 4 (a) to 4 (e).

As shown in FIG. 4 (a), a main wiring board 10 having a plurality of wiring board regions arranged therein in a matrix shape is first prepared, and a flip-chip mounting type IC element 2 and a chip-type electronic component 3 are mounted at predetermined positions in each of wiring board regions on an upper surface of the main wiring board 10. A filter element 8 and a shielding conductor pattern 7 are formed in each of the wiring board regions within the main wiring board 10, which is not illustrated.

At this time, circuit wiring and the like, provided in the IC element 2, the chip-type electronic component 3, and the main wiring board 10 are respectively electrically connected, to compose a predetermined oscillation circuit and amplification circuit.

Next, as shown in FIG. 4 (b), a sealing resin layer 4 is formed by applying and thermally curing liquid resin such as epoxy on the main wiring board 10 in such a manner that a window 4a is formed on an upper surface of the IC element 2 by screen printing or the like. The sealing resin layer 4 is not formed in the window 4a.

As shown in FIG. 4 (e), the sealing resin layer 4 is then cut using a first dicing blade 41 along a boundary between regions corresponding to respective wiring boards. In the boundary between the regions corresponding to the wiring boards, therefore, a groove 43 bridging over the boundary is formed. At this time, it is preferable that the dicing blade 41, together with the sealing resin layer 4, cuts a surface layer portion of the main wiring board 10 and a lower end of the groove 43 is positioned in a portion slightly below the upper surface of the main wiring board 10. This allows a notch 9 to be simultaneously formed in cutting the main wiring board 10 using a second dicing blade 42, described later. The main wiring board 10 is to be cut is caused to have sufficient strength such that it is not easily divided by an external force.

Next, as shown in FIG. 4 (d), conductive resin ink composed of liquid resin such as epoxy having metal powder such as Ag powder dispersed therein is applied so as to cover a surface of the sealing resin layer 4 and the upper surface of the IC element 2 exposed from the window 4a by a screen printing method or the like. In this case, the groove 43 is also filled with the conductive ink. After the conductive ink is thus applied, it is thermally cured.

Thereafter, as shown in FIG. 4 (e), the main wiring board 10 is cut and divided along the boundary between the regions corresponding to the respective wiring boards 1 using the second dicing blade 42 having a width smaller than the first dicing blade 41. At this time, the cured conductive ink with which the groove 43 is filled is cut so that an extension 6 of a shielding layer 5 is formed.

The above-mentioned electronic component module according to the present invention is manufactured through the foregoing steps.

According to the above-mentioned manufacturing method, the shielding layer 5 is formed by applying and curing the conductive ink on the main wiring board 10 having the plurality of board regions, so that the shielding layer 5 can be collectively formed in a simple method for the plurality of board regions. This allows the production efficiency of the electronic component module having an electromagnetic wave shielding function to be far improved. In the conventional electronic component module, a shielding cover made of a metal is mounted in order to shield unnecessary electromagnetic waves from the exterior. In this case, significantly complicated operations such as an aligning step and a soldering step of the shielding cover are required, and the operations must be individually performed for the plurality of board regions, so that the productivity is low. Contrary to this, the manufacturing method according to the present embodiment eliminates the necessity of complicated operations such as an aligning step and a soldering step of the shielding cover, which can contribute to an improvement in the productivity of the electronic component module having the electromagnetic wave shielding function.

Radio communications equipment can be configured by incorporating the above-mentioned electronic component module according to the present invention and an antenna and a transmitting/receiving circuit that are connected to the electronic component module.

Such radio communications equipment need not necessarily employ, between the electronic component module and other high-frequency components together incorporated into the radio communications equipment, a structure for restraining the effect of electromagnetic waves leaking out of each of components, for example, a structure for arranging the electronic component module and other high-frequency components sufficiently spaced apart from each other and a structure for mounting the shielding cover made of a metal on the electronic component module.

Thus, the configuration of the radio communications equipment is simplified, so that the radio communications equipment can be one being small in size and superior in communication characteristics.

The present invention is not limited to the above-mentioned embodiment. Various changes and improvements are possible without departing from the scope of the present invention.

Although in the above-mentioned embodiment, the window 4a is formed on the sealing resin layer 4, for example, the window 4a is not limited to one for exposing a part of the upper surface of the IC element 2. For example, the window 4a may cause the whole upper surface of the IC element 2 to be exposed.

Although in the above-mentioned embodiment, the shielding layer 5 is formed of a resin material containing metal powder, it may be formed of a metal thin film composed of Au, Ag, Cu, or the like in place of the resin material. In a case where the shielding layer 5 is formed of the metal thin film, the thickness of the shielding layer can be made thin. Thus, the height and the size of the electronic component module can be further reduced. An evaporation method such as sputtering, for example, is used to form the metal thin film.

Although in the above-mentioned embodiment, the shielding layer 5 is formed such that the upper surface and the side surface of the sealing resin layer 4 are covered therewith, the shielding layer 5 may be formed in such a manner that only the upper surface of the sealing resin layer 4 is covered therewith.

Although in the above-mentioned embodiment, the notch 9 is formed on the wiring board 1, it goes without saying that the present invention is also applicable to a wiring board 1 having no notch 9 formed thereon.

Although in the above-mentioned embodiment, description was made of the communication module as the electronic component module, the present invention is also applicable to electronic component modules other than the communication module, for example, automotive electronic components and others.

The invention claimed is:

1. An electronic component module comprising:
  a wiring board;
  an IC element on the wiring board;
  a sealing resin layer covering the IC element, excluding a part of a surface, on the opposite side of the wiring board, of the IC element;
  a shielding layer, wherein the shielding layer adheres to the sealing resin layer and a portion, which is not covered with the sealing resin layer, of the IC element, wherein the portion comprises the center of the IC element,
  wherein the shielding layer comprises one or more metal powders or a metal film,
  a filter element comprising an LC resonance circuit in the wiring board, and
  a shielding conductor pattern in the wiring board positioned between the filter element and the IC element,
  wherein the outer periphery of the shielding layer has an extension extended to a portion below the upper surface of the wiring board along the side surface of the sealing resin layer, and a lower end of the extension is arranged at a height position equal to or less than the shielding conductor pattern.

2. A radio communication equipment comprising the electronic component module according to claim 1, and an antenna and a transmitting/receiving circuit that are connected to the electronic component module.

3. The electronic component module according to claim 1, wherein the shielding layer further comprises resin, and the one or more metal powders are dispersed in the resin.

4. The electronic component module according to claim 1, if wherein the shielding layer covers the filter element.

* * * * *